US012777785B2

(12) United States Patent
Zhu

(10) Patent No.: US 12,777,785 B2
(45) Date of Patent: Oct. 27, 2026

(54) DISPLAY PANEL AND DISPLAY DEVICE

(71) Applicant: Wuhan China Star Optoelectronics Semiconductor Display Technology Co., Ltd., Wuhan (CN)

(72) Inventor: Qiwen Zhu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 365 days.

(21) Appl. No.: 18/504,206

(22) Filed: Nov. 8, 2023

(65) Prior Publication Data

US 2025/0031532 A1 Jan. 23, 2025

(30) Foreign Application Priority Data

Jul. 18, 2023 (CN) ........................ 202310885925.8

(51) Int. Cl.

| | |
|---|---|
| ***H10K 59/124*** | (2023.01) |
| ***H10K 59/131*** | (2023.01) |
| ***H10K 59/40*** | (2023.01) |

(52) U.S. Cl.

CPC ......... *H10K 59/124* (2023.02); *H10K 59/131* (2023.02); *H10K 59/40* (2023.02)

(58) Field of Classification Search

CPC .... H10K 59/124; H10K 59/131; H10K 59/40; H10K 59/00; H10K 59/12; H10K 59/1213; H10D 86/441; H10D 86/481; H10D 86/60

See application file for complete search history.

(56) References Cited

U.S. PATENT DOCUMENTS

2022/0013589 A1* 1/2022 Lee ........................ G06F 3/0412
2022/0344418 A1* 10/2022 Xiao .................... H10K 59/122

* cited by examiner

*Primary Examiner* — Marc-Anthony Armand
(74) *Attorney, Agent, or Firm* — Nathan & Associates Patent Agents Ltd.; Menachem Nathan

(57) ABSTRACT

A display panel and a display device are disclosed. The display panel has a display region and a bonding region disposed on a side of the display region. The display panel includes: a substrate; a bonding pin in the bonding region, the bonding pin including a first metal layer; a first insulating layer on the substrate, the first insulating layer being disposed in the display region and the bonding region and provided with a groove, and the groove running through the first insulating layer and exposing at least a portion of the first metal layer; and an organic functional layer in the display region, the organic functional layer being disposed on s side of the first insulating layer away from the substrate.

16 Claims, 7 Drawing Sheets

DISPLAY PANEL AND DISPLAY DEVICE

CROSS-REFERENCE TO RELATED APPLICATION

This application claims the priority to Chinese Application No. 202310885925.8, filed on Jul. 18, 2023. The contents of the above application are incorporated herein by reference in their entireties.

FIELD

The present disclosure relates to display technologies, and in particular, to a display panel and a display device.

BACKGROUND

Polarizer (POL) Less technology can improve the bending performance of display panels and reduce power consumption, and is the development direction of display technologies. In an on-cell touch display panel, the POL Less technology is implemented by using a combination of black matrix (BM)+color film (CF) to replace the polarizer.

The BM+CF structure is prepared after the touch layer is prepared. In the process of patterning the BM and the CF, the chemical solution causes side etching of metal in a bonding region, for example, side etching of metal of a bonding pin. The side etching of metal is likely to generate metal debris. The metal debris leads to a short circuit between neighboring bonding pins, resulting in an abnormal display function.

SUMMARY

A display panel according to the present disclosure has a display region and a bonding region disposed on a side of the display region. The display panel includes: a substrate; a bonding pin in the bonding region, the bonding pin including a first metal layer; a first insulating layer on the substrate, the first insulating layer being disposed in the display region and the bonding region and provided with a groove, and the groove running through the first insulating layer and exposing at least a portion of the first metal layer; and an organic functional layer in the display region, the organic functional layer being disposed on s side of the first insulating layer away from the substrate.

In one or more embodiments, the organic functional layer is a color film layer; the display panel further includes a second insulating layer, the second insulating layer is disposed in the display region and the bonding region, and on the side of the first insulating layer away from the substrate, the groove runs through the second insulating layer, and an edge of the first insulating layer close to the groove is flush with an edge of the second insulating layer close to the groove.

In one or more embodiments, the first insulating layer is an inorganic layer and the second insulating layer is an organic layer.

In one or more embodiments, the organic functional layer is a semipermeable organic layer, the semipermeable organic layer is disposed in the display region and the bonding region; the groove runs through the semipermeable organic layer, and an edge of the first insulating layer close to the groove is flush with an edge of the semipermeable organic layer close to the groove.

In one or more embodiments, an edge of the first insulating layer close to the groove is spaced apart from the first metal layer, or the edge of the first insulating layer close to the groove overlaps two ends of the first metal layer.

In one or more embodiments, the first metal layer includes a first sublayer and a second sublayer stacked together, the second sublayer is disposed on two sides of the first sublayer, and an etching rate of the second sublayer is less than an etching rate of the first sublayer.

In one or more embodiments, the first sublayer is of metal aluminum, and the second sublayer is of metal titanium.

In one or more embodiments, the bonding pin further includes a second metal layer, the second metal layer is disposed on a side of the first metal layer close to the substrate. The display panel further includes a touch layer and multiple thin film transistors, wherein the touch layer is in contact with a side of the first insulating layer close to the substrate, and the thin film transistors are disposed on one side of the touch layer close to the substrate; the first metal layer and the touch layer are disposed in a same layer, and the second metal layer and a source drain layer of at least one of the thin film transistors are disposed in a same layer.

In one or more embodiments, the display panel further includes a third insulating layer, the third insulating layer being disposed on the side of the first insulating layer close to the substrate, extending to the groove, and covering two ends of the second metal layer.

A display device according to the present disclosure includes a display panel above.

BRIEF DESCRIPTION OF DRAWINGS

The following describes specific implementations of the present disclosure in detail with reference to the accompanying drawings, to make the technical solutions and other beneficial effects of the present disclosure obvious.

Figure 1:
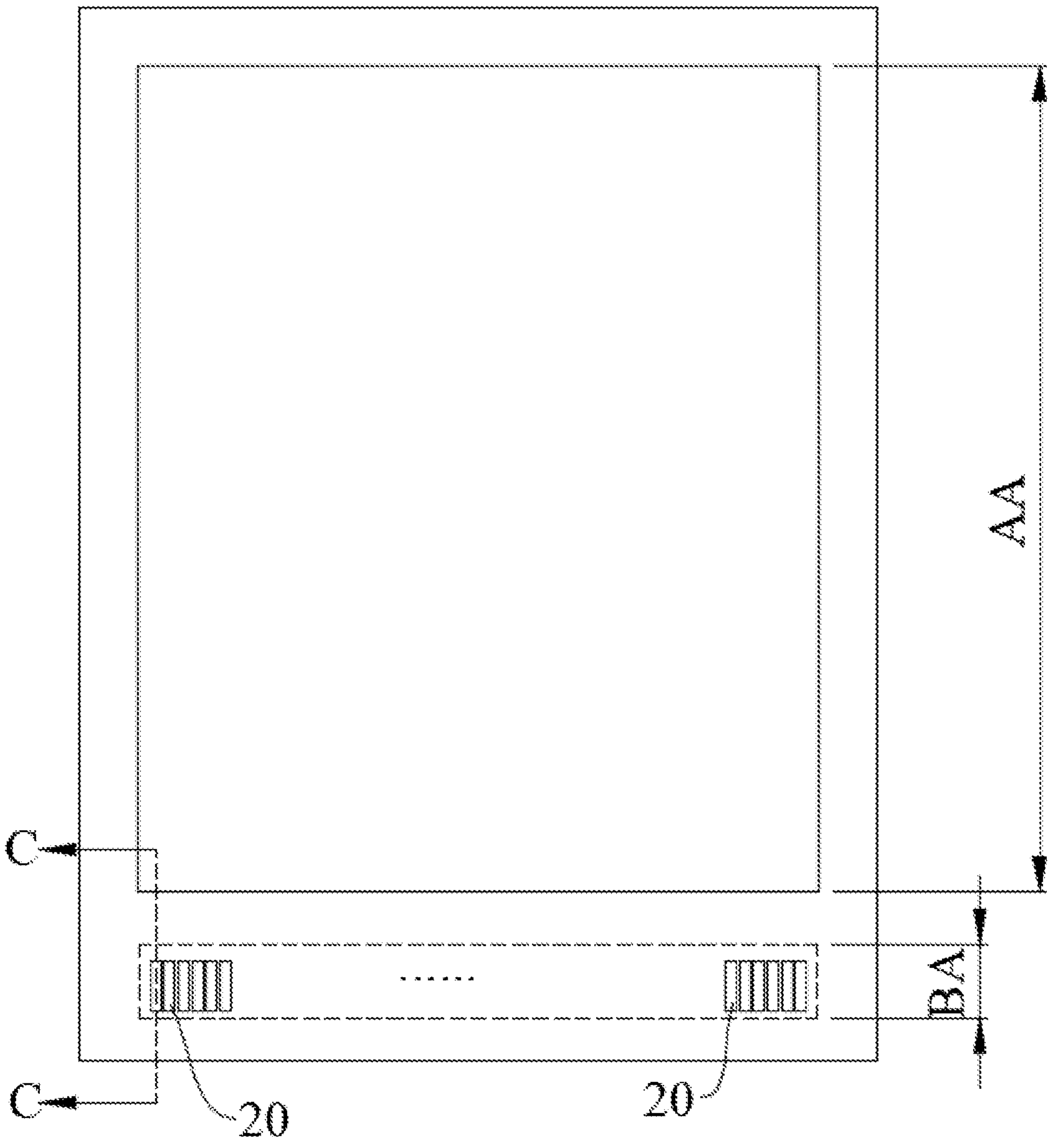
FIG. 1 is a schematic top view of a display panel according to the present disclosure.

LIST OF REFERENCE NUMERALS display region AA, bonding region BA, substrate 10, bonding pin 20, first metal layer 21, first sublayer 211, second sublayer 212, second metal layer 22, third metal layer 23, first insulating layer 31, second insulating layer 32, third insulating layer 33, groove 310, first groove 311, organic functional layer 40, color resist 41, black matrix 42, semipermeable organic layer 43, touch layer 60, thin film transistor 70, source/drain layer 71, gate layer 72, light-emitting unit 80.

DETAILED DESCRIPTION

The technical solutions in the embodiments of the present disclosure are clearly and completely described below with reference to the accompanying drawings in the embodiments of the present disclosure. Apparently, the described embodiments are merely some embodiments rather than all the embodiments of the present disclosure. All other embodiments obtained by a person skilled in the art based on the embodiments of the present disclosure without creative efforts shall fall within the protection scope of the present disclosure. In addition, it should be understood that the specific implementations described herein are merely used for describing and illustrating the present disclosure, but are not intended to limit the present disclosure. In one or more embodiments of the present disclosure, without the contrary explanation, the directional terms such as “above” and “below” generally refer to “above” and “below” in actual use or a working state of a device, and specifically refer to drawing directions of the corresponding accompanying drawings; and “inside” and “outside” are relative to the contour of the device.

Figure 2:
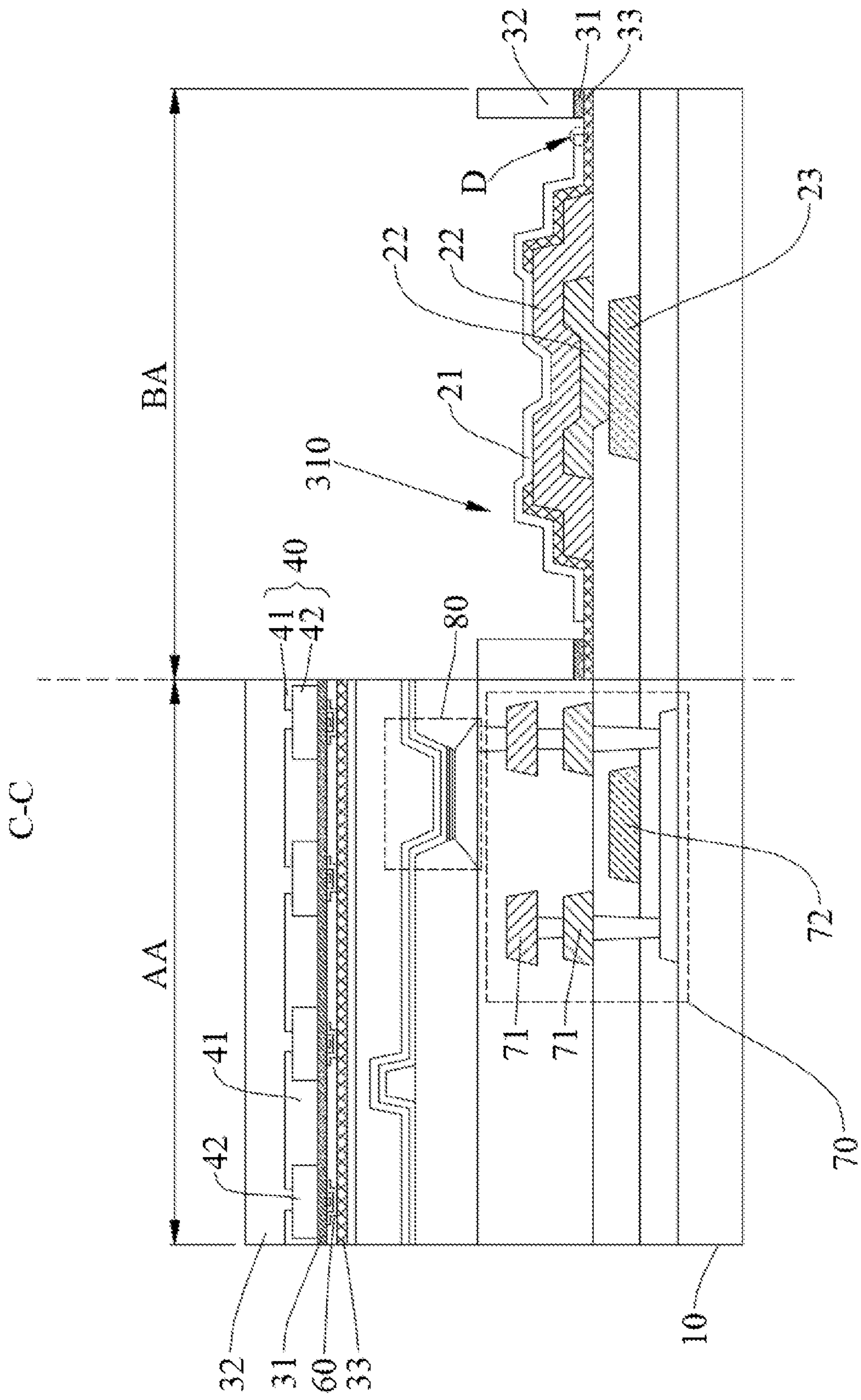
FIG. 2 is a structural schematic cross-sectional view taken along line C-C in FIG. 1.

Referring to FIG. 1 to FIG. 2, a display panel according to the present disclosure includes a display region AA and a bonding region BA on one side of the display region AA. The display panel includes a substrate 10, a bonding pin 20, a first insulating layer 31, and an organic functional layer 40. The bonding pin 20 is disposed in the bonding region BA. The bonding pin 20 includes a first metal layer 21. The first insulating layer 31 is disposed on the substrate 10. The first insulating layer 31 is disposed in the display region AA and the bonding region BA. The first insulating layer 31 is provided with a groove 310. The groove 310 runs through the first insulating layer 31 and at least exposes a portion of the first metal layer 21. The organic functional layer 40 is disposed in the display region AA. The organic functional layer 40 is disposed on a side of the first insulating layer 31 away from the substrate 10.

In one or more embodiments of the present disclosure, the first insulating layer 31 is covered on the first metal layer 21 of the bonding pin 20, and the organic functional layer 40 is prepared on the first insulating layer 31. The first insulating layer 31 can protect the first metal layer 21, to prevent side etching caused by the contact of the first metal layer 21 of the bonding pin 20 with the chemical solution in the process of preparing the organic functional layer 40.

The following describes the technical solutions of the present disclosure by specific embodiments.

Figure 3:
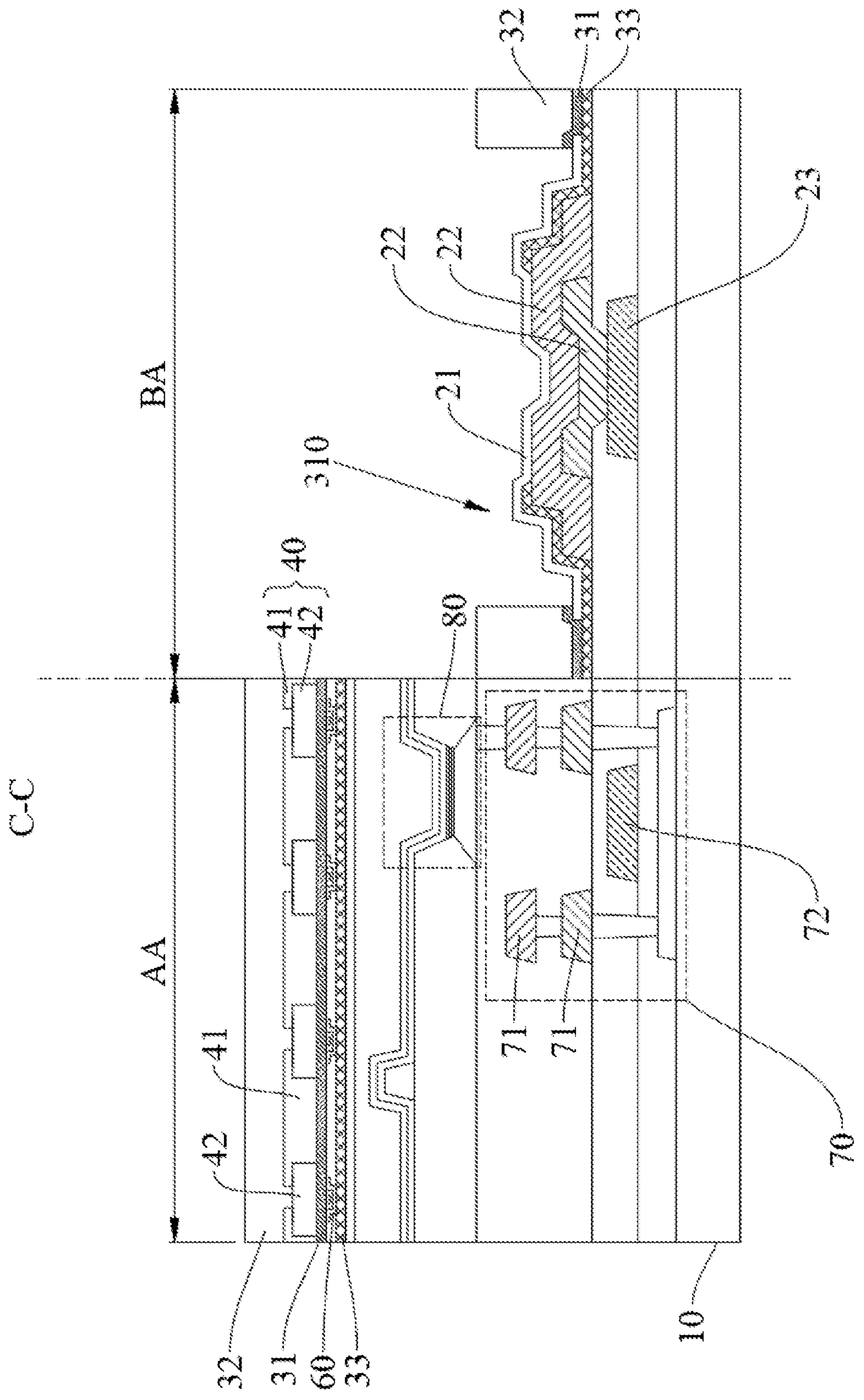
FIG. 3 is another structural schematic cross-sectional view taken along line C-C in FIG. 1.

The display panel may be a light-emitting diode (LED) panel, an organic light-emitting diode (OLED) panel, a mini light-emitting diode (mini-LED) panel, a micro light-emitting diode (micro-LED) panel, or the like. In FIG. 2 and FIG. 3, the OLED panel is used as an example to introduce the technical solutions of one or more embodiments of the present disclosure, but the type of the display panel is not limited thereto.

As shown in FIG. 1 and FIG. 2, the display panel includes a display region AA and a non-display region (not shown) outside the display region AA. The non-display region includes a bonding region BA. The bonding region BA is disposed on a side of the display region AA. Multiple light-emitting units 80 are provided in the display region AA. At least one of the light-emitting units 80 may include a red light-emitting unit, a green light-emitting unit, and a blue light-emitting unit. The light-emitting unit 80 of each color can display a corresponding color, thereby realizing display of a color image. At least one of the light-emitting unit 80 may include an anode layer, a light-emitting material layer, and a cathode layer stacked together, which is not limited herein.

As shown in FIG. 2 and FIG. 3, the display panel further includes multiple thin film transistors 70. At least one of the thin film transistors 70 is disposed on the substrate 10 and is electrically connected to a corresponding light-emitting unit 80 to drive the light-emitting unit 80 to emit light.

The bonding region BA is configured to bond with an external component. For example, the external component may be a driver chip, a flexible printed circuit board, or the like. The external component may provide a driving signal or supply power to the display panel to drive the display panel.

The bonding region BA is provided with multiple bonding pins 20. At least one of the bonding pins 20 is electrically connected to a bonding terminal of the external component, so that the driving signal or power is provided or supplied to the display panel. The bonding pins 20 may be electrically connected to the bonding terminal of the external component by anisotropic conductive film (ACF) bonding, which is not limited herein.

The bonding pin 20 includes a first metal layer 21. The first metal layer 21 may be a single layer or a multi-layer metal stack. For example, the first metal layer 21 may be formed of any one of molybdenum (Mo), aluminum (Al), chromium (Cr), gold (Au), titanium (Ti), nickel (Ni), neodymium (Nd), or copper (Cu), or any alloy thereof.

The substrate 10 may be a flexible substrate or a rigid substrate. For example, the material of the flexible substrate may be polyimide, polycarbonate, polyethersulfone, polyethylene terephthalate, polyethylene naphthalate, polyarylate, or glass fiber reinforced plastic. The material of the rigid substrate may be glass or the like.

The first insulating layer 31 is disposed on the substrate 10. The first insulating layer 31 covers the display region AA and the bonding region BA. In the bonding region BA, the first insulating layer 31 is provided with a groove 310. The groove 310 runs through the first insulating layer 31 and at least exposes a portion of the first metal layer 21. By the exposure of the first metal layer 21, the first metal layer 21 can be electrically connected to the external component.

The organic functional layer 40 is disposed in the display region AA and is disposed on a side of the first insulating layer 31 away from the substrate 10. The organic functional layer 40 may be used to replace the polarizer, to implement the POL Less technology. Because the cost of the organic functional layer 40 is lower than that of the polarizer, the cost of the display panel can be reduced.

As shown in FIG. 2, in one or more embodiments, the organic functional layer 40 is a color film layer. The organic functional layer 40 includes a black matrix 42. The black matrix 42 is provided with multiple openings corresponding to the light-emitting units 80, respectively. A color resist 41 is arranged in each of the openings. The color of the color resist 41 is corresponding to the color of the light-emitting unit 80. For example, the color resist 41 includes a red resist, a green resist, or a blue resist. The red resist is corresponding to a red light-emitting unit, the green resist is corresponding to a green light-emitting unit, and the blue resist is corresponding to a blue light-emitting unit. The combination of the color resists 41 and the black matrix 42 can replace the function of the polarizer.

Figure 4:
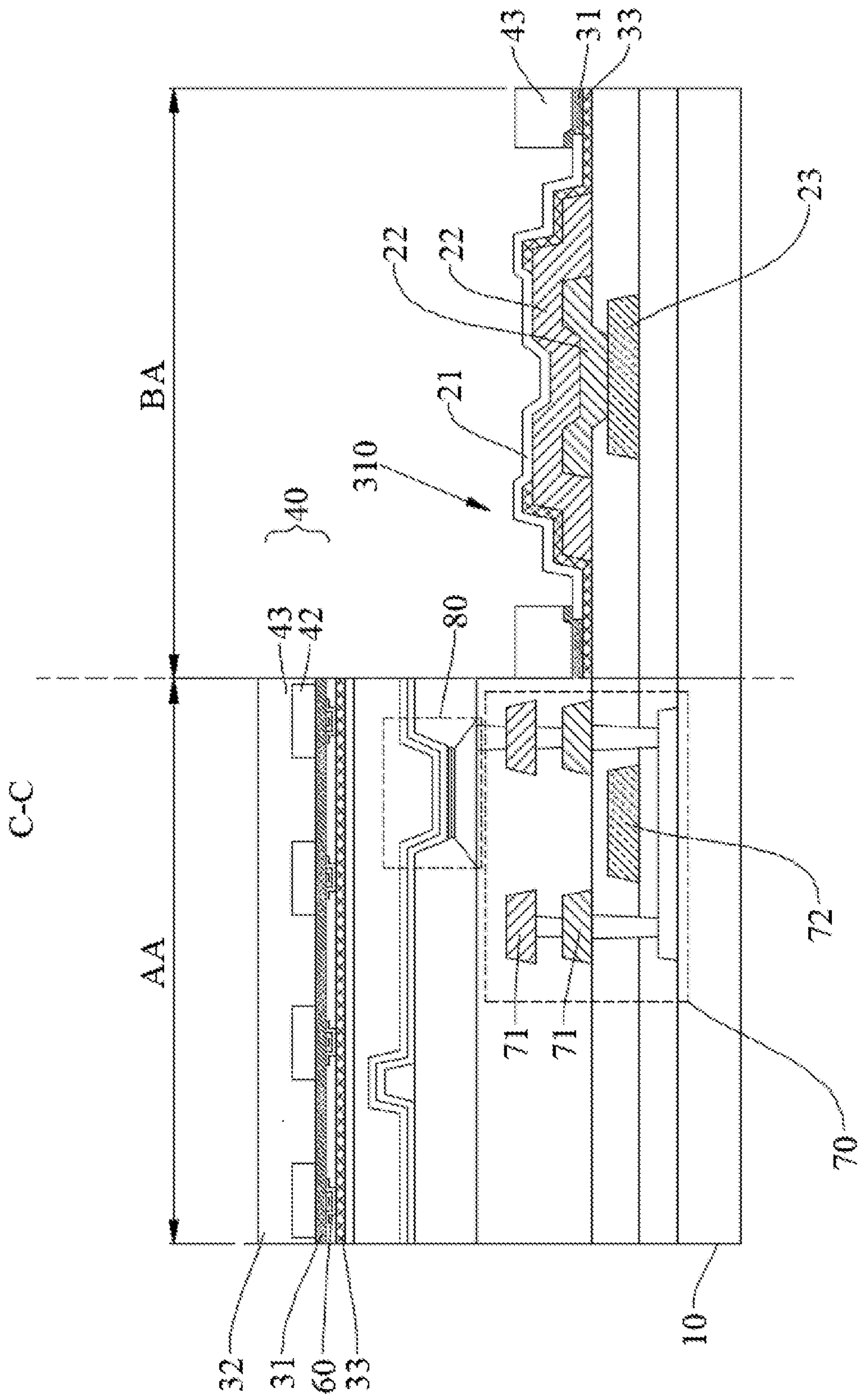
FIG. 4 is still another structural schematic cross-sectional view taken along line C-C in FIG. 1.

As shown in FIG. 4, in one or more embodiments, the organic functional layer 40 is a semipermeable organic layer 43. The organic functional layer 40 includes a black matrix 42. The black matrix 42 is provided with multiple openings corresponding to the light-emitting units 80, respectively. The black matrix 42 is covered by a continuous semipermeable organic layer 43. The semipermeable organic layer 43 fills the openings of the black matrix 42. The semipermeable organic layer 43 allows part of the light to pass through, thereby reducing the reflectivity of ambient light. The combination of the semipermeable organic layer 43 and the black matrix 42 can replace the function of the polarizer.

For example, the semipermeable organic layer 43 may have a high transmittance for red, green, and blue light, but a low transmittance for light of other wavelengths.

In one or more embodiments, other organic layers may also be used to replace the function of the polarizer, as long as the reflectivity of ambient light can be reduced, which is not limited herein.

As shown in FIG. 2 and FIG. 3, in one or more embodiments, the display panel further includes a second insulating layer 32. The second insulating layer 32 is disposed in the display region AA and the bonding region BA. The second insulating layer 32 is disposed on the side of the first insulating layer 31 away from the substrate 10. The groove 310 runs through the second insulating layer 32. An edge of the first insulating layer 31 close to the groove 310 is flush with an edge of the second insulating layer 32 close to the groove 310. Because the edge of the first insulating layer 31 close to the groove 310 is flush with the edge of the second insulating layer 32 close to the groove 310. The first insulating layer 31 and the second insulating layer 32 may be patterned using a same mask and in a same process to form the groove 310. In this way, one mask is saved, thereby reducing the preparation costs of the display panel. In addition, the first insulating layer 31 can protect the side surfaces of the first metal layer 21, so as to prevent side etching of the first metal layer 21 by the chemical solution in the process of preparing the organic functional layer 40, thereby improving the product yield of the display panel.

It should be noted that, as shown in FIG. 3, in a case that the organic functional layer 40 is a color film layer, the second insulating layer 32 is an organic layer or an inorganic layer. As shown in FIG. 4, in a case that the organic functional layer 40 includes the semipermeable organic layer 43, the second insulating layer 32 may be omitted, and the semipermeable organic layer 43 serves as an insulating layer, so that the preparation process can be simplified.

In one or more embodiments, the first insulating layer 31 is an inorganic layer. For example, the first insulating layer 31 may be a single layer or a multi-layer stack of silicon nitride, silicon oxide, silicon oxynitride, or the like. The second insulating layer 32 is an organic layer or an inorganic layer. For example, in a case that the second insulating layer 32 is an inorganic layer, the second insulating layer 32 may be a single layer or a multi-layer stack of silicon nitride, silicon oxide, silicon oxynitride, or the like. In a case that the second insulating layer 32 is an organic layer, the second insulating layer 32 may be an organic photoresist or the like. With the configuration of the second insulating layer 32 as an organic layer, the material of the organic layer has a leveling property and can evenly cover the organic functional layer 40 and form a flat upper surface, thereby improving the surface flatness of the display panel.

In addition, with the configuration of the second insulating layer 32 as an organic layer, when the groove 310 is formed, the second insulating layer 32 may be patterned using a mask, and the first insulating layer 31 is then patterned using the second insulating layer 32 as a photoresist, so that the groove 310 runs through the first insulating layer 31. With the use of the second insulating layer 32 as the photoresist, the steps of photoresist coating, exposure, and development in the patterning process can be omitted, thereby simplifying the preparation process of the display panel.

As shown in FIG. 2, in one or more embodiments, the edge of the first insulating layer 31 close to the groove 310 is spaced apart from the first metal layer 21. In other words, the groove 310 completely exposes two ends of the first metal layer 21, and is spaced apart from the two ends of the first metal layer 21. By such a configuration, the bonding area of the first metal layer 21 can be increased, thereby improving the conductivity of the electrical connection between the bonding pin 20 and the external component.

As shown in FIG. 3, in one or more embodiments, the edge of the first insulating layer 31 close to the groove 310 overlap two ends of the first metal layer 21. In other words, in an extending direction of the bonding pin 20, the groove 310 exposes a middle region of the first metal layer 21, and the two ends of the first metal layer 21 are covered by the first insulating layer 31 and the second insulating layer 32. By such a configuration, end surfaces of the first metal layer can be covered, to prevent the first metal layer 21 from peeling off, thereby improving the firmness of the bonding pin 20.

Figure 5:
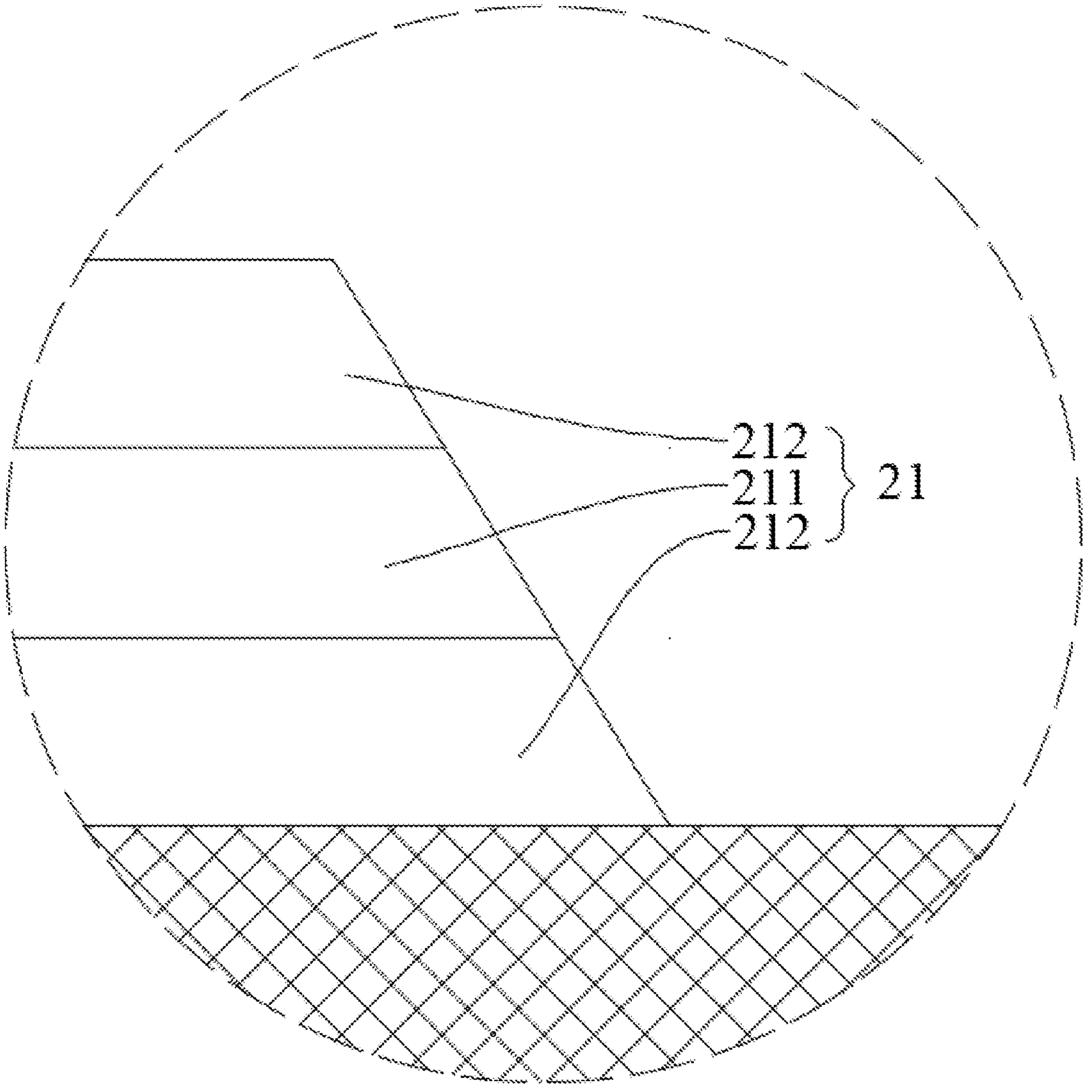
FIG. 5 is a structural schematic enlarged view at D in FIG. 2.

As shown in FIG. 5, in one or more embodiments, the first metal layer 21 includes a first sublayer 211 and a second sublayer 212 stacked together. The second sublayer 212 is disposed on two sides of the first sublayer 211, and an etching rate of the second sublayer 212 is less than an etching rate of the first sublayer 211. For example, the first sublayer 211 may be of metal aluminum, metal copper, or the like, and the second sublayer 212 may be of metal titanium or the like, which is not limited herein. The second sublayer 212 is disposed on surfaces of the two sides of the first sublayer 211, so that the second sublayer 212 can protect the first sublayer 211, to prevent the first sublayer layer 211 from oxidization. In addition, the etching rate of titanium is less than the etching rate of aluminum, so when the side surface of the first metal layer 21 is etched, aluminum is more prone to side etching, resulting in the collapse of titanium in the upper layer to forming metal debris, affecting the display function of the display panel.

As shown in FIG. 2 and FIG. 3, in one or more embodiments, the bonding pin 20 further includes a second metal layer 22. The second metal layer 22 is disposed on a side of the first metal layer 21 close to the substrate 10. The second metal layer 22 is in contact with the first metal layer 21, thereby increasing the cross-sectional area of the bonding pin 20 and reducing the resistance.

The display panel further includes a touch layer 60. The touch layer 60 is in contact with a side of the first insulating layer 31 close to the substrate 10. The touch layer 60 may be a self-capacitance touch layer or a mutual-capacitance touch layer, which is not limited herein. For example, in a case that the touch layer 60 is a mutual-capacitance touch layer, the touch layer 60 includes a touch driver layer and a touch sensing layer. A capacitor is formed at an intersection of the touch driver layer and the touch sensing layer. In one or more embodiments, an orthographic projection of the touch layer 60 on the organic functional layer 40 is disposed within the black matrix 42, so that the touch layer 60 does not affect the aperture ratio of the display panel.

In one or more embodiments, the first insulating layer 31 is in contact with the black matrix 42. By such a configuration, the black matrix 42 is not in contact with metal in the touch layer 60, thereby preventing the black matrix 42 from reacting with the touch layer 60 to prevent the failure of the touch function of the product.

The thin film transistor 70 is disposed on a side of the touch layer 60 close to the substrate 10. The first metal layer 21 and the touch layer 60 are disposed in a same layer. For example, the first metal layer 21 may be disposed in a same layer as with the touch driver layer or may be disposed in a same layer as the touch sensing layer. The second metal layer 22 and a source drain layer 71 of the thin film transistor 70 may be disposed in a same layer.

Further, the bonding pin 20 further includes a third metal layer 23. The third metal layer 23 is disposed on a side of the second metal layer 22 close to the substrate 10. The third metal layer 23 may be disposed in a same layer as gate layers 72 of the thin film transistor 70. The configuration of the bonding pin 20 as a multi-layer stack including the first metal layer 21, the second metal layer 22, and the third metal layer 23 can further increase the cross-sectional area of the bonding pin 20 to reduce the resistance.

As shown in FIG. 2 and FIG. 3, in one or more embodiments, the display panel further includes a third insulating layer 33. The third insulating layer 33 may be an inorganic layer. For example, the third insulating layer 33 may be a single layer or a multi-layer stack of silicon nitride, silicon oxide, silicon oxynitride, or the like. The third insulating layer 33 is disposed on a side of the first insulating layer 31 close to the substrate 10, extends to the groove 310, and covers two ends of the second metal layer 22. By such a configuration, the third insulating layer 33 can protect the two ends of the second metal layer 22 to prevent side etching of the second metal layer 22 in subsequent processes.

Figure 6:
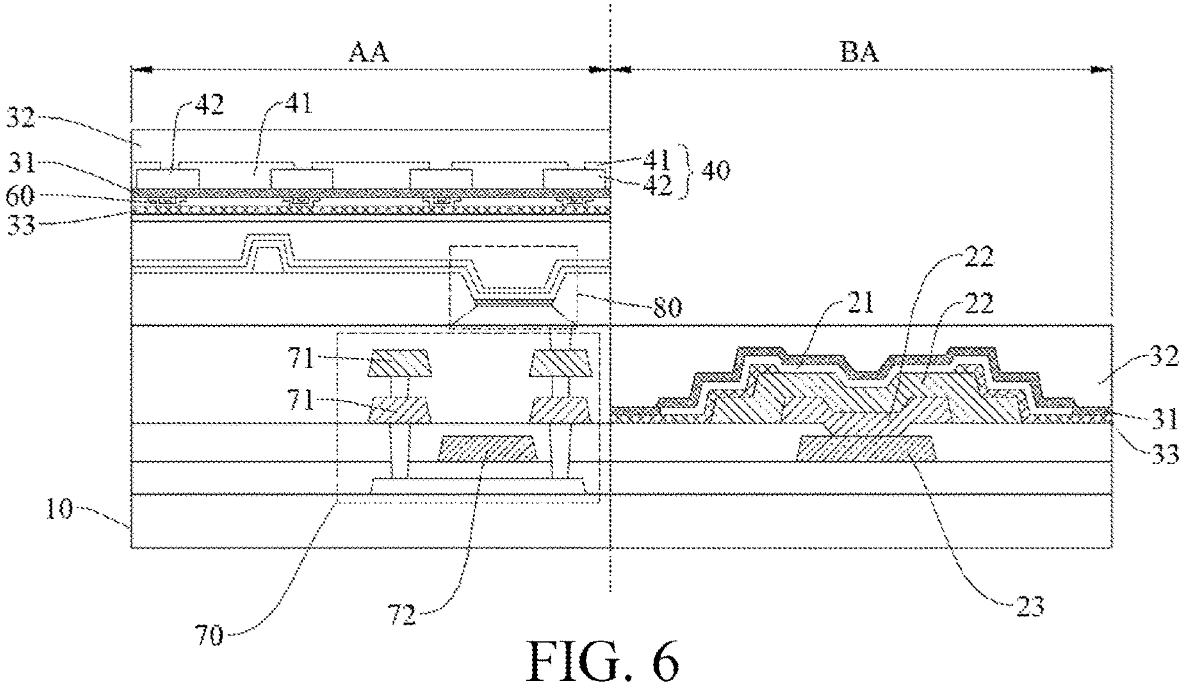
FIG. 6 to FIG. 8 are a flowchart of a process of preparing a display panel according to the present disclosure.
Figure 7:
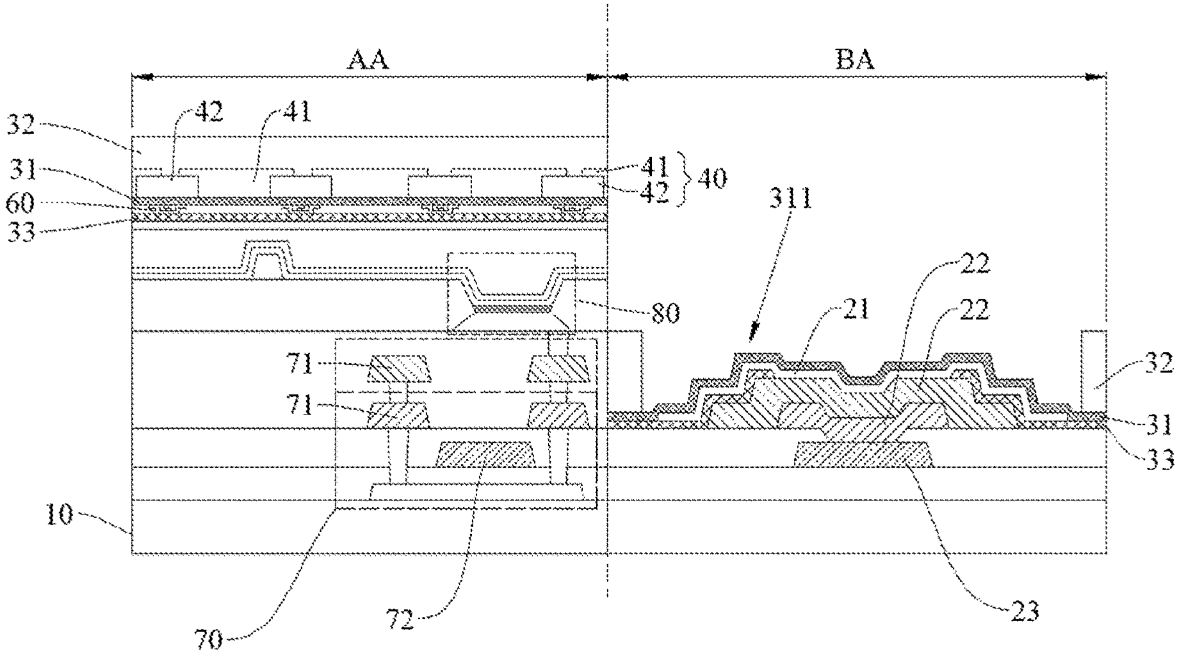
Figure 8:
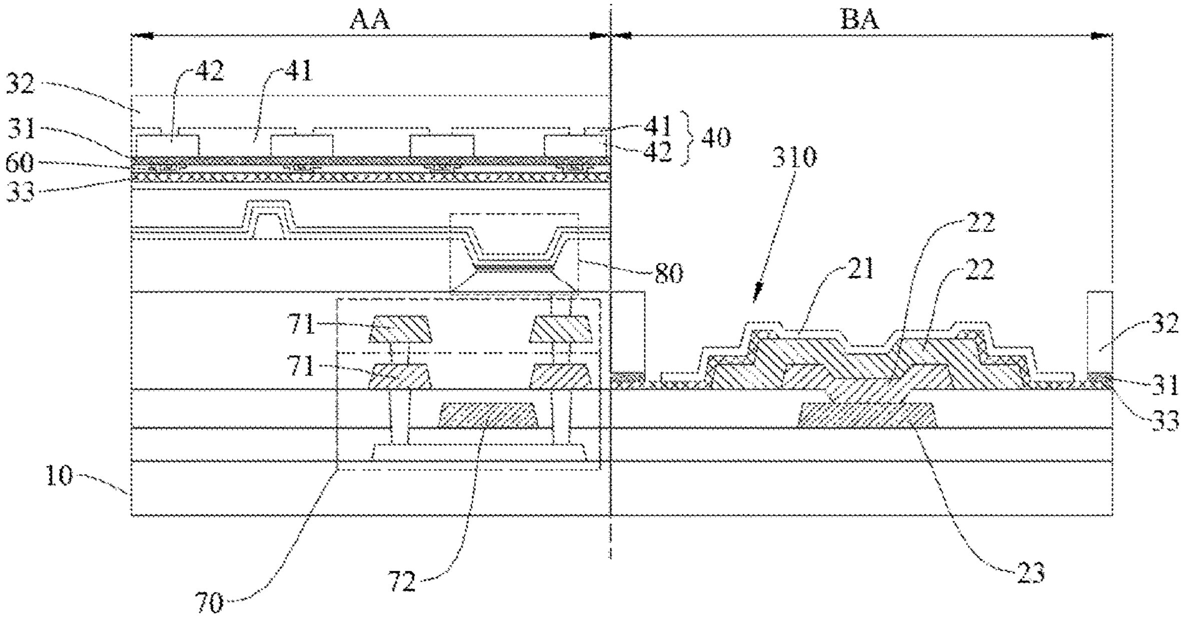

According to one or more embodiments, as shown in FIG. 6 to FIG. 8, based on the same inventive concept, a display panel preparation method, which is used for preparing the display panel described above, includes steps S10~S20.

At S10, as shown in FIG. 6, a substrate 10 is provided, and a first metal layer 21 is formed on the substrate 10, where the first metal layer 21 is disposed in the bonding region BA of the display panel; a first insulating film layer is formed on the first metal layer 21; and an organic functional layer 40 is formed on the first insulating film layer, where the organic functional layer 40 is disposed in the display region AA of the display panel.

In step S10, the first insulating film layer is formed on the first metal layer 21, and the first insulating film layer covers the first metal layer 21. The first insulating film layer can protect the first metal layer 21 to prevent the first metal layer 21 from being affected by the chemical solution in the subsequent process of preparing the organic functional layer 40 to result in side etching of the first metal layer 21.

At S20, as shown in FIG. 8, the first insulating film layer is patterned to form the groove 310. To be specific, the film layer corresponding to the groove 310 in the first insulating film layer is removed by patterning, to expose the first metal layer 21.

In step S20, the groove 310 can be formed in the first insulating layer 31 at the position corresponding to the first metal layer 21 by patterning the first insulating film layer, to expose the first metal layer, for bonding with an external component.

It should be noted that, in one or more embodiments of the present disclosure, "patterning" refers to processing such as photoresist coating, exposure, development, etching, and photoresist removal on a metal layer, an inorganic layer, or a metal oxide layer. Patterning includes processing such as photoresist coating, exposure, and development on an organic layer. A "film layer" is a layer that has not been patterned, and may be a complete layer of film. A "layer" is formed after patterning. For example, the first insulating film layer is a complete metal layer, and the first insulating layer 31 is a layer formed after patterning. A second insulating film layer and a second insulating layer 32 have a similar relationship.

A process of preparing a metal film or an inorganic film includes physical vapor deposition (PVD) and the like, which is not limited herein. A process of preparing an organic functional layer 40 includes photoresist coating, exposure, and development and the like. An organic film layer may be prepared by photoresist coating, exposure, and development and other processes.

In one or more embodiments, the step of patterning the first insulating film layer to form the first insulating layer 31 provided with the groove 310 includes steps S21~S22.

At S21, as shown in FIG. 6 and FIG. 7, the organic functional layer is a color film layer, a second insulating film layer is prepared on the organic functional layer 40, and the second insulating film layer is patterned to form a second insulating layer 32.

At S22, as shown in FIG. 7 and FIG. 8, the first insulating film layer is patterned using the second insulating layer 32 as a photoresist to form the first insulating layer 31 provided with the groove 310. The second insulating layer 32 is an organic layer, and an edge of the first insulating layer 31 close to the groove 310 is flush with an edge of the second insulating layer 32 close to groove 310.

In step S21, the second insulating film layer is patterned to form the first groove 311 on the second insulating film layer, thereby forming the second insulating layer 32. The second insulating layer 32 is an organic layer or an inorganic layer. For example, in a case that the second insulating layer 32 is an inorganic layer, the second insulating layer 32 may be a single layer or a multi-layer stack of silicon nitride, silicon oxide, silicon oxynitride, or the like. In a case that the second insulating layer 32 is an organic layer, the second insulating layer 32 may be an organic photoresist or the like. In a case that the second insulating layer 32 is an organic layer, steps for preparing the second insulating layer 32 include photoresist coating, exposure, and development, and may further include baking.

In one or more embodiments, in step S21, the organic functional layer 40 is a semipermeable organic layer 43, and the second insulating layer 32 is the semipermeable organic layer 43.

In step S22, the first insulating film layer is patterned using the second insulating layer 32 as a photoresist to form the first insulating layer 31. The first insulating layer 31 is provided with the groove 310. The groove 310 runs through the first insulating layer 31 and at least exposes a portion of the first metal layer 21. The second insulating layer 32 is an organic layer, and the edge of the first insulating layer 31 close to the groove is flush with the edge of the second insulating layer 32 close to the groove 310.

Because the first insulating film layer is patterned after the second insulating layer 32 is prepared, a mask for patterning the first insulating film layer in advance is no longer required, thereby reducing the preparation costs of the display panel. In addition, the first insulating film layer can protect the side surface of the first metal layer 21, so as to prevent the chemical solution in the process of preparing the organic functional layer 40 from causing side etching of the first metal layer 21, thereby improving the product yield of the display panel.

With the configuration of the second insulating layer 32 as an organic layer, when the groove 310 is formed, the second insulating film layer may be first patterned using a mask to form the second insulating layer 32, and the first insulating film layer is then patterned using the second insulating layer 32 as a photoresist, so that the groove 310 runs through the first insulating film layer to form the first insulating layer 31. With the use of the second insulating layer 32 as the photoresist, the steps of photoresist coating, exposure, and development in the patterning process can be omitted, thereby simplifying the preparation process of the display panel.

A display device according to the present disclosure includes the display panel above.

In one or more embodiments, the display device may be a mobile phone, a smart bracelet, a VR device, a tablet computer, a notebook computer, a digital photo frame, a navigator, or any other product or component with a display function.

In the foregoing embodiments, the descriptions of each embodiment have different focuses, and for a part that is not described in detail in an embodiment, reference may be made to the relevant description of other embodiments.

The display panel and the display device according to one or more embodiments of the present disclosure are described in detail above. The principles and implementations of the present disclosure are described by using specific examples in this specification, and the descriptions of the embodiments are merely intended to help understand the methods and core ideas of the present disclosure. It should be understood by a person of ordinary skill in the art that modifications can be made to the technical solutions described in the foregoing embodiments, or equivalent replacements can be made to some technical features in the technical solutions.

What is claimed is:

1. A display panel, having a display region and a bonding region disposed on a side of the display region, the display panel comprising:

a substrate;

a bonding pin in the bonding region, wherein the bonding pin comprises a first metal layer;

a first insulating layer on the substrate, wherein the first insulating layer is disposed in the display region and the bonding region and provided with a groove, and the groove runs through the first insulating layer and exposes at least a portion of the first metal layer; and an organic functional layer in the display region, wherein the organic functional layer is disposed on a side of the first insulating layer away from the substrate, wherein the first metal layer comprises a first sublayer and a second sublayer stacked together, the second sublayer is disposed on two sides of the first sublayer, and an etching rate of the second sublayer is less than an etching rate of the first sublayer.

2. The display panel according to claim 1, wherein the organic functional layer is a color film layer;

the display panel further comprises a second insulating layer, the second insulating layer is disposed in the display region and the bonding region, and on the side of the first insulating layer away from the substrate;

the groove runs through the second insulating layer, and an edge of the first insulating layer close to the groove is flush with an edge of the second insulating layer close to the groove.

3. The display panel according to claim 2, wherein the first insulating layer is an inorganic layer and the second insulating layer is an organic layer.

4. The display panel according to claim 1, wherein the organic functional layer is a semipermeable organic layer, the semipermeable organic layer is disposed in the display region and the bonding region;

the groove runs through the semipermeable organic layer, and an edge of the first insulating layer close to the groove is flush with an edge of the semipermeable organic layer close to the groove.

5. The display panel according to claim 2, wherein an edge of the first insulating layer close to the groove is spaced apart from the first metal layer, or the edge of the first insulating layer close to the groove overlaps two ends of the first metal layer.

6. The display panel according to claim 1, wherein the first sublayer is of metal aluminum, and the second sublayer is of metal titanium.

7. The display panel according to claim 1, wherein the bonding pin further comprises a second metal layer, the second metal layer is disposed on a side of the first metal layer close to the substrate;

the display panel further comprises a touch layer and a plurality of thin film transistors, wherein the touch layer is in contact with a side of the first insulating layer close to the substrate, and the thin film transistors are disposed on one side of the touch layer close to the substrate;

the first metal layer and the touch layer are disposed in a same layer, and the second metal layer and a source drain layer of at least one of the thin film transistors are disposed in a same layer.

8. The display panel according to claim 7, further comprising a third insulating layer, wherein the third insulating layer is disposed on the side of the first insulating layer close to the substrate, the third insulating layer extends to the groove and covers two ends of the second metal layer.

9. A display device comprising a display panel, wherein the display panel has a display region and a bonding region disposed on a side of the display region, the display panel comprises:

a substrate;

a bonding pin in the bonding region, wherein the bonding pin comprises a first metal layer;

a first insulating layer on the substrate, wherein the first insulating layer is disposed in the display region and the bonding region and provided with a groove, and the groove runs through the first insulating layer and exposes at least a portion of the first metal layer; and an organic functional layer in the display region, wherein the organic functional layer is disposed on a side of the first insulating layer away from the substrate, wherein the first metal layer comprises a first sublayer and a second sublayer stacked together, the second sublayer is disposed on two sides of the first sublayer, and an etching rate of the second sublayer is less than an etching rate of the first sublayer.

10. The display device according to claim 9, wherein the organic functional layer is a color film layer;

the display panel further comprises a second insulating layer, the second insulating layer is disposed in the display region and the bonding region, and on the side of the first insulating layer away from the substrate;

the groove runs through the second insulating layer, and an edge of the first insulating layer close to the groove is flush with an edge of the second insulating layer close to the groove.

11. The display device according to claim 10, wherein the first insulating layer is an inorganic layer and the second insulating layer is an organic layer.

12. The display device according to claim 11, wherein the organic functional layer is a semipermeable organic layer, the semipermeable organic layer is disposed in the display region and the bonding region;

the groove runs through the semipermeable organic layer, and an edge of the first insulating layer close to the groove is flush with an edge of the semipermeable organic layer close to the groove.

13. The display device according to claim 10, wherein an edge of the first insulating layer close to the groove is spaced apart from the first metal layer, or the edge of the first insulating layer close to the groove overlaps two ends of the first metal layer.

14. The display device according to claim 9, wherein the first sublayer is of metal aluminum, and the second sublayer is of metal titanium.

15. The display device according to claim 9, wherein the bonding pin further comprises a second metal layer, the second metal layer is disposed on a side of the first metal layer close to the substrate;

the display panel further comprises a touch layer and a plurality of thin film transistors, wherein the touch layer is in contact with a side of the first insulating layer close to the substrate, and the thin film transistors are disposed on one side of the touch layer close to the substrate;

the first metal layer and the touch layer are disposed in a same layer, and the second metal layer and a source drain layer of at least one of the thin film transistors are disposed in a same layer.

16. The display device according to claim 15, further comprising a third insulating layer, wherein the third insulating layer is disposed on the side of the first insulating layer close to the substrate, the third insulating layer extends to the groove and covers two ends of the second metal layer.

* * * * *